United States Patent
Korsunsky

(10) Patent No.: US 6,764,319 B1
(45) Date of Patent: Jul. 20, 2004

(54) ELECTRICAL CONNECTOR HAVING CONTACTS WITH ANTI-WICKING MEANS

(75) Inventor: Iosif R. Korsunsky, Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/439,992

(22) Filed: May 15, 2003

(51) Int. Cl.[7] ............................................. H01R 12/00
(52) U.S. Cl. ........................................ 439/83; 439/876
(58) Field of Search ............................ 439/83, 876, 62, 439/637

(56) References Cited

U.S. PATENT DOCUMENTS

| | | | |
|---|---|---|---|
| 3,989,331 A | * 11/1976 | Hanlon | .......................... 439/70 |
| 4,976,634 A | * 12/1990 | Green et al. | ................. 439/589 |
| 5,004,426 A | 4/1991 | Barnett | |
| 5,209,681 A | * 5/1993 | Brown | ......................... 439/876 |
| 5,462,456 A | * 10/1995 | Howell | ..................... 439/733.1 |
| 5,492,266 A | * 2/1996 | Hoebener et al. | ......... 228/248.1 |
| 5,772,454 A | * 6/1998 | Long, Jr. | ....................... 439/83 |
| 5,934,951 A | * 8/1999 | Lai et al. | ...................... 439/876 |
| 6,155,845 A | * 12/2000 | Lin et al. | ....................... 439/83 |
| 6,261,136 B1 | 7/2001 | Dennis | |
| 6,575,791 B1 | * 6/2003 | Korsunsky | ................... 439/637 |
| 6,623,284 B1 | * 9/2003 | Korsunsky | .................... 439/83 |

* cited by examiner

*Primary Examiner*—Tho D. Ta
*Assistant Examiner*—Larisa Tsukerman
(74) *Attorney, Agent, or Firm*—Wei Te Chung

(57) ABSTRACT

An electrical connector (1) for soldering to a printed circuit board includes a housing (10) defining a number of channels (22) therethrough, a number of contacts (12) received in corresponding channels. At least two contacts share a same channel. Each contact includes an intermediate portion (124) pre-coated with a Sn—Pb plating which has a higher melting point than that of the soldering paste. The intermediate portions of corresponding contacts in the same channel are soldered with each other by heating the Sn—Pb plating and a wicking barrier (28) is formed on soldering area. The wicking barriers block the melted soldering paste from passing therethrough to thereby protect contact portions when soldering the contacts with the printed circuit board.

6 Claims, 8 Drawing Sheets

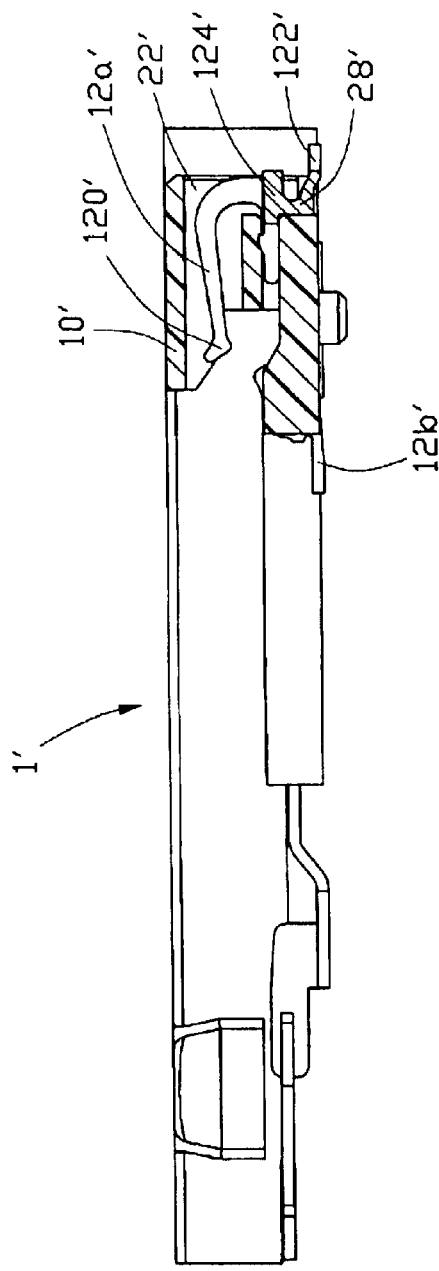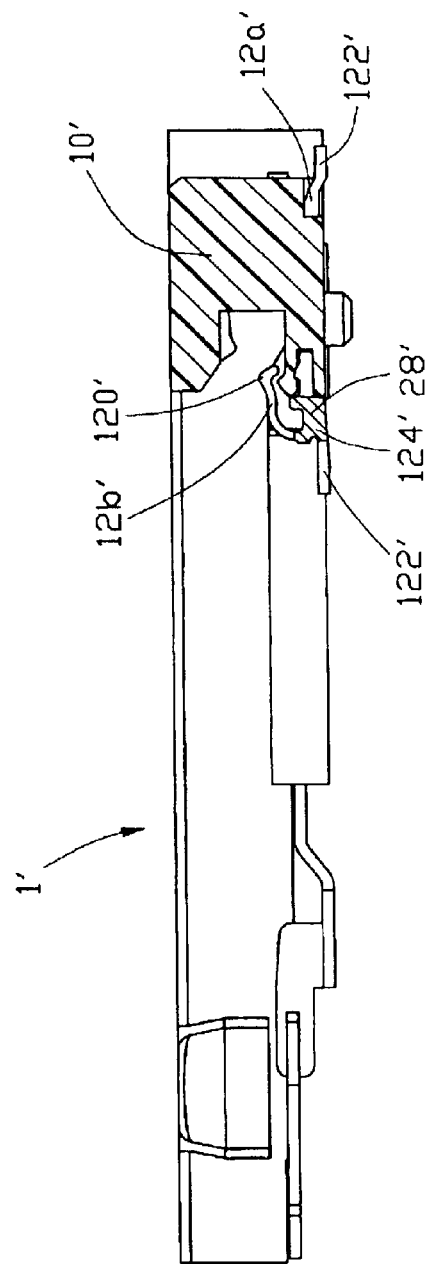

ELECTRICAL CONNECTOR HAVING CONTACTS WITH ANTI-WICKING MEANS

CROSS-REFERENCE TO RELATED APPLICATIONS

This patent application is related to a U.S. patent application Ser. No. 10/095,983, entitled "ELECTRICAL CONNECTOR PROVIDING RELIABLE ELECTRICAL INTERCONNECTION WITH MATED DEVICES", filed on Mar. 11, 2002, assigned to the same assignee.

BACKGROUND OF THE INVENTION

1. Field of the Invention

The present invention generally relates to an electrical connector, and particularly to an electrical connector for soldering with a printed circuit board.

2. Description of Prior Arts

It is well known that for an electrical connector mounted on a printed circuit board, wicking is always a serious problem. The gold plating contacting area of a contact is easily contaminated because the melted, poor-conductivity solder and flux may move along the surface of the contact and reach to the contacting area such that decrease electrical performance of the contact. Especially, due to continuing trends toward miniaturization and high density arrangement for making a connector, the contacts of connectors become smaller and smaller and make the wicking problem much more serious than before, so as to the electrical performance of the contact.

Some connectors are known which appear to have desirable anti-wicking characteristics by providing a cavity, or intervening space, between the contact area and solder tail portion of the contact, such as those described in Japanese Utility Model Publication No. 6-54273 and U.S. Pat. No. 5,735,696. Obviously, this kind of contact is too complicated for manufacturing so that unavoidably increases the manufacture-cost thereof.

The contact having another type of anti-wicking means is disclosed in U.S. Pat. No. 5,209,681. It recites an electrical contact has a tab provided in a passage which extends through the contact. The tab is dimensioned to provide a barrier, past which solder cannot flow. Consequently, as the contact is mounted to a printed circuit board, the tab prevents the solder from wicking from the mounting portion to the mating portion. However, such kind of contact is also too complicated for manufacturing so that unavoidably increases the manufacture-cost thereof, also.

Hence, it is desirable and more cost effective to have an electrical contact that can provide improved anti-wicking means to maintain the reliable electrical performance thereof when soldered to a printed circuit board.

BRIEF SUMMARY OF THE INVENTION

Accordingly, it is an object of the present invention to provide an electrical connector having contacts which substantially eliminate wicking of molten solder or solder flux up from solder tail portions to contact portions when soldering the solder tail portions of the connector to a printed circuit board.

In order to achieve the above-mentioned object, an electrical connector for soldering with a printed circuit board in accordance with the present invention, includes an insulating housing defining a number of contact receiving channels therethrough, a number of contacts and a number of secondary conductors respectively received in corresponding contact receiving channels. Each contact includes a contact portion for electrically engaging with a complementary component, a tail portion for soldering to the printed circuit board, and an intermediate portion interconnecting the contact portion and the tail portion. Each intermediate portion is pre-coated with a Sn—Pb plating which has a higher melting point than that of the soldering paste. The secondary conductors are respectively soldered with intermediate portions of corresponding contacts and a wicking barrier is formed on soldering area by heating the pre-coated Sn—Pb plating. The wicking barriers block the melted soldering paste from passing therethrough to thereby protect contact portions when soldering the contacts to the printed circuit board.

Other objects, advantages and novel features of the invention will become more apparent from the following detailed description of the present embodiment when taken in conjunction with the accompanying drawings.

BRIEF DESCRIPTION OF THE DRAWINGS

FIG. 7 is a cross-sectional view of an electrical connector in accordance with a second embodiment of the present invention;

FIG. 8 is view similar to FIG. 7 while taken from another cross-section;

DETAILED DESCRIPTION OF THE INVENTION

Figure 1:
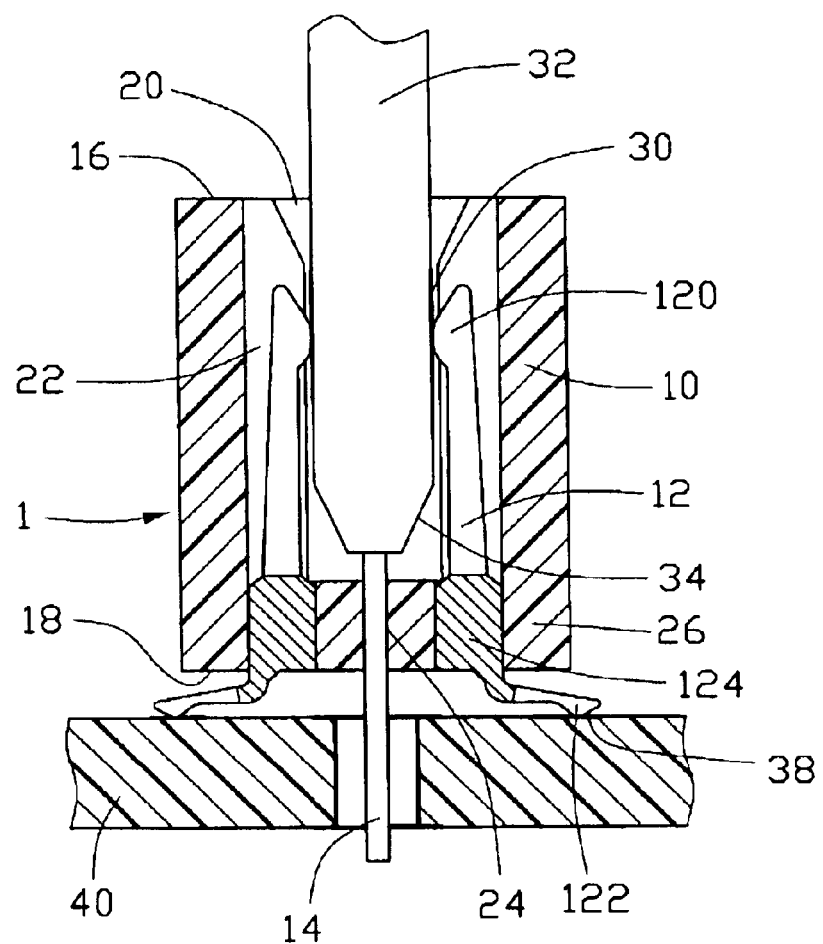
FIG. 1 is a cross-sectional view of an assembly of an electrical connector in accordance with a first embodiment of the present invention, a mother board and a daughter board.

Reference will now be made to the drawing figures to describe the present invention in detail.

Figure 2:
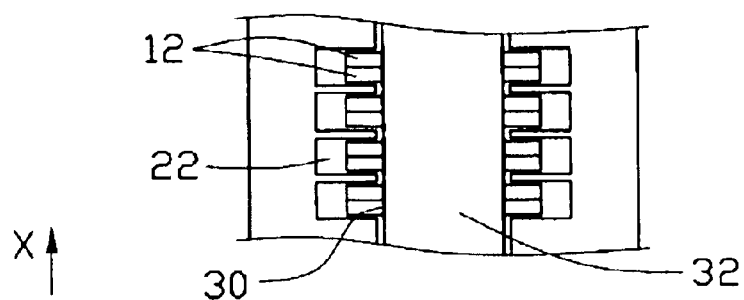
FIG. 2 is a partial top planar view of FIG. 1.
Figure 3:
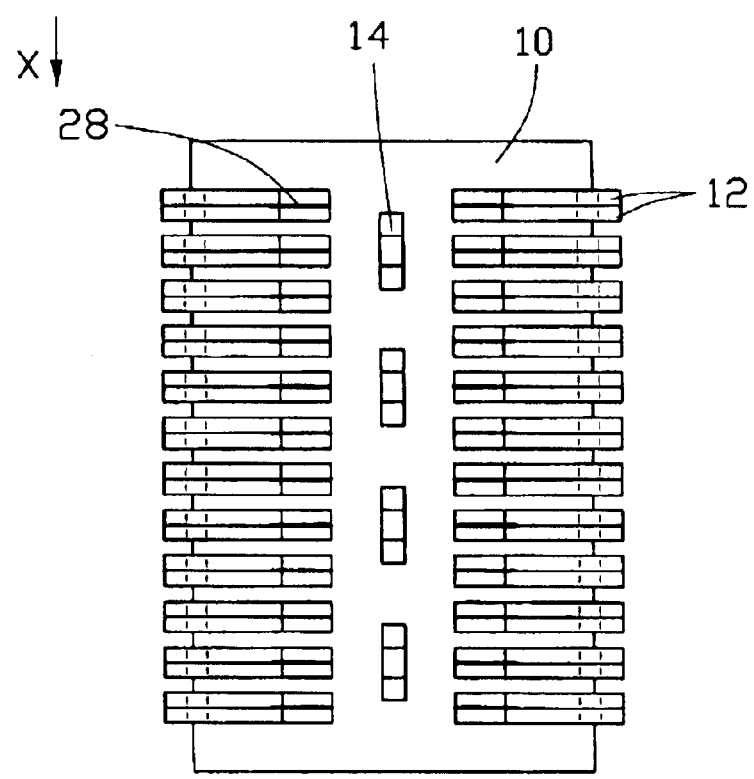
FIG. 3 is a reduced bottom planar view of FIG. 1.

With reference to FIGS. 1–3, an electrical connector 1 in accordance with a first embodiment of the present invention is shown. The electrical connector 1 comprises an insulating housing 10, a number of conductive contacts 12 received in the housing 10 and a number of fasteners 14 retained to the housing 10. The housing 10 includes a top surface 16 and an opposite bottom surface 18 and defines a slot 20 and a number of contact receiving channels 22. The contact receiving channels 22 are communicating with the slot 20. The housing 10 further defines a number of holes 24 in a bottom portion 26 thereof along a longitudinal direction, designated by "X" (FIG. 2) in which the fasteners 14 are fixedly received.

Figure 4:
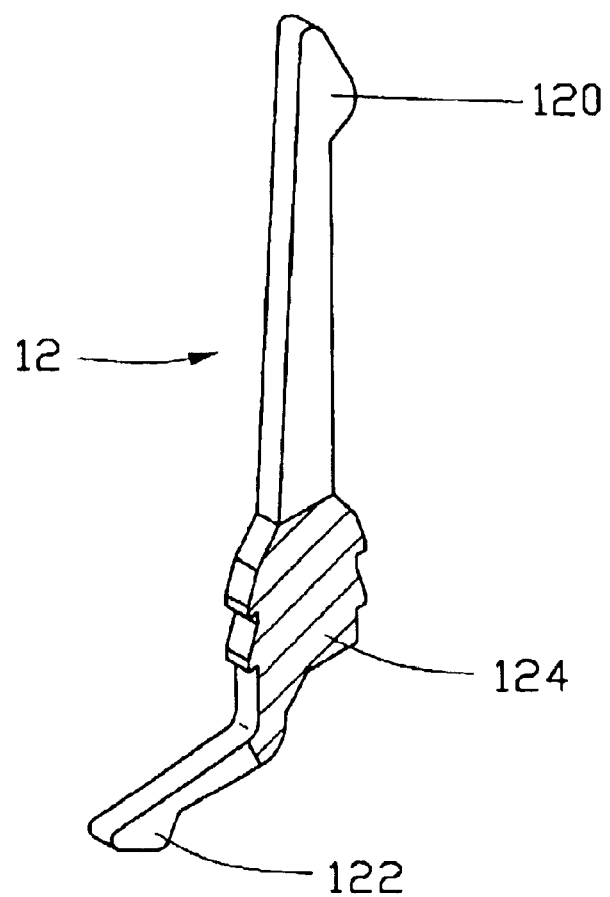
FIG. 4 is a perspective view of a single conductive contact shown in FIG. 1.

Together referring to FIGS. 1–4, each conductive contact 12 includes a contact portion 120 extending into the slot 20 for electrically contacting a first conductive pad 30 on a daughter board 32 whose edge 34 is received in the slot 20, and an opposite tail portion 122 downwardly extending beyond the bottom surface 18 of the insulating housing 10 for being soldered with and electrically connecting to a second conductive pad 38 on a mother board 40. Therefore, electrical paths are provided from the mother board 40 to the daughter board 32 via the conductive contacts 12. Particularly referring to FIG. 4, each conductive contact 12 further has a retention portion 124 formed between the contact portion 120 and the tail portion 122 for retaining the conductive contact 12 in corresponding contact receiving channel 22. The retention portion 124 of each conductive contact 12 is pre-coated with a Sn—Pb plating before being assembled in the housing 10, which is designated in section lines (FIG. 4). In the preferred embodiment, the Sn/Pb ratio of the Sn—Pb plating is 93%/7%, while the Sn—Pb ratio of the soldering paste is 60%/40%. However, it is obvious that the Sn—Pb plating can be replaced by any other material which has a higher melting point than that of the soldering paste.

Figure 5:
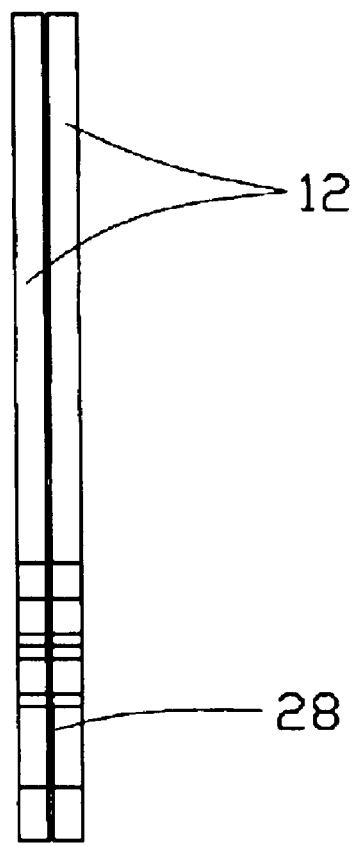
FIG. 5 is a side view of a pair of conductive contacts which share the same contact receiving channel.
Figure 6:
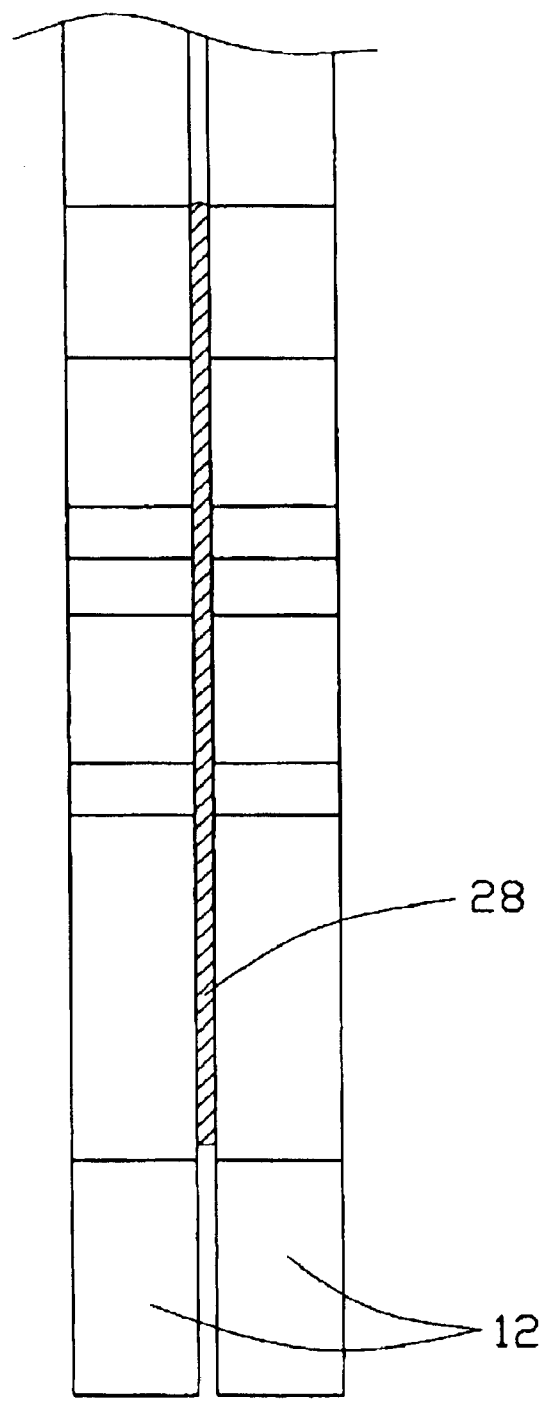
FIG. 6 is a partially enlarged view of the pair of conductive contacts shown in FIG. 5.

Turn to FIGS. 5–6 in conjunction with FIGS. 1 and 2, each contact receiving channel 22 receives two conductive contacts 12 arranged side by side in the "X" direction. Before being accommodated into the housing 10, the two conductive contacts 12 sharing the same channel 22 are soldered with each other by using an appropriate heating means, such as a hot bar (not shown), to heat the Sn—Pb plating of the retention portions 124 (with the temperature of 350° C.~400° C.) to thereby form a wicking barrier 28 therebetween. The wicking barrier 28 can prevent the melted soldering paste around corresponding tail portions 122 from passing therethrough because the melting point of the wicking barrier is higher than that of the soldering paste.

Figure 9:
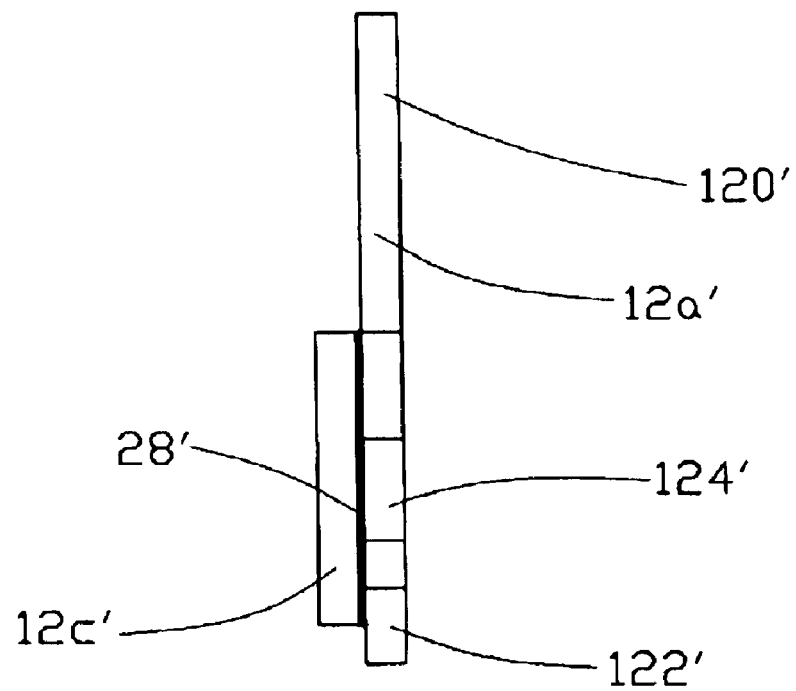
FIG. 9 is a side view of a contact and a secondary conductor soldered therewith.
Figure 10:
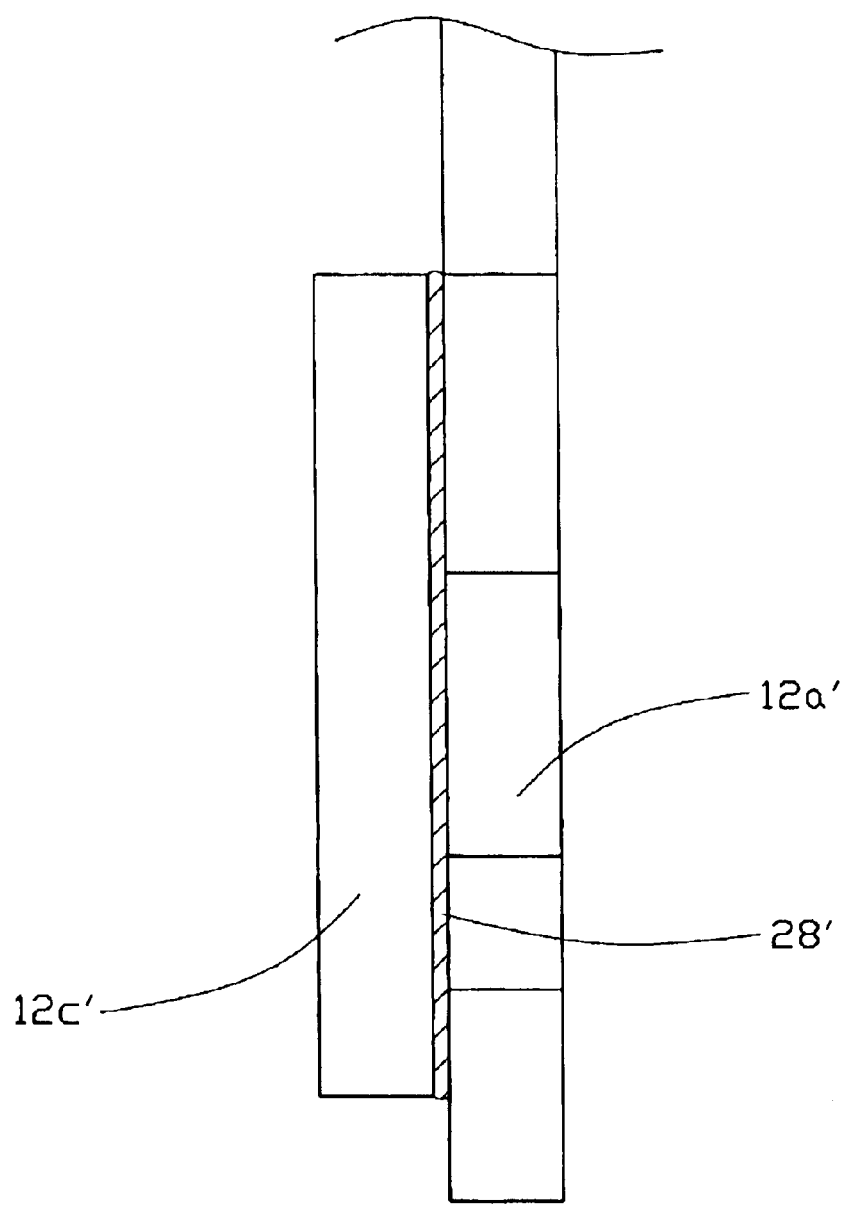
FIG. 10 is a partially enlarged view of FIG. 9.

Referring to FIGS. 7–8 in conjunction with FIGS. 9 and 10, an electrical connector 1' in accordance with a second embodiment of the present invention is shown. The connector 1' includes a number of upper and lower contacts 12a', 12b', a number of secondary conductor 12c', and an insulating housing 10' defining two rows of channels 22'. Each channel 22' receives an individual upper/lower contact 12a'/12b' with an individual secondary conductor 12c' attached thereon. Each upper/lower contact 12a'/12b' includes a contact portion 120' for electrically connecting with a complementary component (not shown), a tail portion 122' for being soldered on a printed circuit board (not shown), and a retention portion 124' interconnecting the contact portion 120' and the tail portion 122'. The retention portion 124' of each contact 12a', 12b' is pre-coated with a Sn—Pb plating (Sn/Pb ratio is 93%/7%) which has a higher melting point than that of the melted soldering paste (Sn/Pb ratio is 60%/40%).

Particularly referring to FIGS. 9 and 10, before each upper/lower contact 12a'/12b' and corresponding secondary conductor 12c' being assembled into the housing 10', the secondary conductor 12c' is soldered with the retention portion 124' of the corresponding upper/lower contact 12a'/12b' by heating the Sn—Pb plating (with the temperature of 350° C.~400° C.) of the upper/lower contact 12a'/12b' to thereby forming a soldered portion 28' on the soldering area. The soldered portion 28' and the corresponding secondary contact 12c' together form a wicking barrier. During soldering the upper/lower contacts 12a'/12b' to the printed circuit board, the wicking barriers can prevent the melted soldering paste around corresponding tail portions 122' of the contacts 12a'/12b' from passing therethrough for the melting point of the soldered portion 28' is higher than that of the melted soldering paste.

It should be noted here that the secondary conductor 12c' of the present invention can have any kind of configurations. The function of the secondary conductor 12c' is to be soldered with the corresponding contacts 12a', 12b' to thereby forming a wicking barrier in the corresponding channel 22'. In an alternative embodiment, instead of pre-coating the Sn—Pb plating on the retention portion 124' of the contact 12a'/12b', the Sn—Pb plating can also be pre-coated on the secondary conductor 12c'.

Besides, the tail portions 122, 122' of the contacts 12, 12a', 12b' of the two embodiments are soldered to the printed circuit board via surface mounted technology, while the tail portions of the contacts can also have needle-eye structures, which are soldered to the printed circuit board via through-hole technology.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An electrical connector mountable on a printed circuit board, comprising:

a number of conductive contacts each having a contacting portion for electrically engaging with a complementary component, a tail portion for being soldered on the printed circuit board, a retention portion interconnecting said contacting and tail portions; and an insulating housing defining therethrough a number of contact receiving channels, each said contact receiving channel receiving therein at least two conductive contacts;

wherein conductive contacts sharing the same contact receiving channel have their retention portions soldered with each other and form a wicking barrier therebetween, said wicking barrier has a higher melting point than that of solder flux during soldering tail portions of said conductive contacts with the printed circuit board to thereby block said solder flux extending to corresponding contacting portions.

2. The electrical connector as described in claim 1, wherein said wicking barrier is obtained by heating a Sn—Pb plating pre-coated on retention portions of corresponding conductive contacts received in the same contact receiving channel before said conductive contacts being assembled into said insulating housing.

3. The electrical connector as described in claim 2, wherein the ratio of said Sn—Pb plating is 93%/7%.

4. The electrical connector as described in claim 3, wherein said conductive contacts sharing the same contact receiving channel are arranged side by side along a longitudinal direction of said insulating housing for electrically connecting the complementary component to the printed circuit board.

5. The electrical connector as described in claim 1, wherein said tail portion of each of said conductive contacts has a needle-eye structure, which is press-fitted in and soldered with the printed circuit board.

6. An electrical connector assembly comprising:

an insulative housing defining a plurality of channels therein; and plural pairs of contacts respectively disposed in the corresponding channels;

each of said pairs including two similar contact pieces face to face abutting against each other, each of said contact pieces defining a contact portion, a solder tail portion and a retention portion therebetween; wherein a wicking barrier is soldered and sandwiched between around two corresponding retention portions of each of said pairs to not only combine said two contact pieces together but also own a higher melting point than a solder paste on a printed circuit board, on which the housing is mounted, for preventing wicking from the solder tail portions to the contact portions poring soldering said solder tails on the corresponding solder pastes, respectively.

* * * * *